(12) United States Patent
Smith et al.

(10) Patent No.: US 9,628,082 B1
(45) Date of Patent: Apr. 18, 2017

(54) STRENGTH-ADJUSTABLE DRIVER

(71) Applicant: Xilinx, Inc., San Jose, CA (US)

(72) Inventors: David S. Smith, Redwood City, CA (US); Xiaobao Wang, Cupertino, CA (US); Arvind R. Bomdica, Palo Alto, CA (US); Balakrishna Jayadev, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/321,577

(22) Filed: Jul. 1, 2014

(51) Int. Cl.
H03K 17/16 (2006.01)
H03K 19/177 (2006.01)
H03K 3/01 (2006.01)

(52) U.S. Cl.
CPC ............ H03K 19/177 (2013.01); H03K 3/01 (2013.01)

(58) Field of Classification Search
CPC ........... H03K 19/00384; H03K 17/145; H03K 17/164; H03K 19/00361; H03K 19/00376; H03K 2005/00026; H03K 2005/00065; H03K 2005/00071; H03K 2005/0011; H03K 5/133; G06F 1/04; G06F 1/10; G06F 1/14; H03L 7/0805; H03L 7/0812; H03L 7/0814

USPC ...... 326/26, 27, 30–34, 82–88, 90; 327/175, 327/276, 392, 394
See application file for complete search history.

(56) References Cited

U.S. PATENT DOCUMENTS

| | | | |
|---|---|---|---|
| 6,175,928 B1 * | 1/2001 | Liu et al. ...................... 713/401 |
| 6,333,639 B1 * | 12/2001 | Lee ................. H03K 19/01758 326/30 |
| 6,417,705 B1 * | 7/2002 | Tursi et al. .................... 327/158 |
| 8,847,635 B2 * | 9/2014 | Chaung et al. ............... 327/108 |
| 2004/0064749 A1 * | 4/2004 | Grossnickle et al. ........ 713/400 |
| 2004/0191976 A1 * | 9/2004 | Udupa et al. ................. 438/200 |
| 2005/0001653 A1 * | 1/2005 | Ahmad ........................... 326/87 |
| 2007/0247194 A1 * | 10/2007 | Jain .................. H03K 19/01852 326/87 |
| 2009/0002017 A1 * | 1/2009 | Bhattacharya ... H03K 19/00376 326/21 |

* cited by examiner

*Primary Examiner* — Alexander H Taningco
*Assistant Examiner* — Seokjin Kim
(74) *Attorney, Agent, or Firm* — LeRoy D. Maunu

(57) ABSTRACT

An apparatus includes a plurality of adjustable driver circuits having output nodes coupled to a signal line. Each adjustable driver circuit is configured to drive the signal line with a portion of a total drive strength indicated by a value of a binary control signal. The apparatus also includes a delay circuit configured to delay the binary control signal provided to each adjustable driver circuit by a respective time period unique to the adjustable driver circuit.

20 Claims, 5 Drawing Sheets

US 9,628,082 B1

STRENGTH-ADJUSTABLE DRIVER

FIELD OF THE INVENTION

The disclosure generally relates to communication circuits, and more particularly to strength-adjustable driver circuits.

BACKGROUND

Programmable integrated circuits (ICs) can be programmed to perform specified logic functions. One type of programmable IC, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile may include both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

I/O communication circuits for ICs are typically designed to function according to a specific I/O standard. There are several different I/O standards in use, and new standards are often introduced. These I/O standards specify various communication criteria such as output drive strength, impedance, receiver type, output driver type, and output signal slew rate.

SUMMARY

An apparatus is disclosed that includes a plurality of adjustable driver circuits having output nodes coupled to a signal line. Each adjustable driver circuit is configured to drive the signal line with a portion of a total drive strength indicated by a value of a binary control signal. The apparatus also includes a delay circuit configured to delay the binary control signal provided to each adjustable driver circuit by a respective time period unique to the adjustable driver circuit.

A method is also disclosed for driving a signal line with a drive strength equal to a total drive strength indicated in a binary control signal. Each of a plurality of adjustable driver circuits, including N adjustable driver circuits, are set to provide $1/N^{th}$ of a first drive strength indicated in the binary control signal. In response to the binary control signal changing to indicate a second drive strength, each of the N adjustable driver circuits is updated, at a respective time unique to the adjustable driver circuit, to provide $1/N^{th}$ of the second drive strength.

An apparatus is disclosed that includes a plurality of adjustable driver circuits having output nodes coupled to a signal line. Each adjustable driver circuit includes a first control input configured to receive a binary control signal input to the apparatus, and a second control input configured to receive a respective enable signal. Each adjustable driver circuit is configured to drive the signal line with a portion of a total drive strength indicated by the binary control signal in response to the enable signal. The apparatus also includes a control circuit configured to adjust the respective enable signals provided to the plurality of adjustable driver circuits to cause the plurality of adjustable driver circuits to respond to changes in the binary control signal one at a time.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings, in which.

DETAILED DESCRIPTION OF THE DRAWINGS

Figure 1:
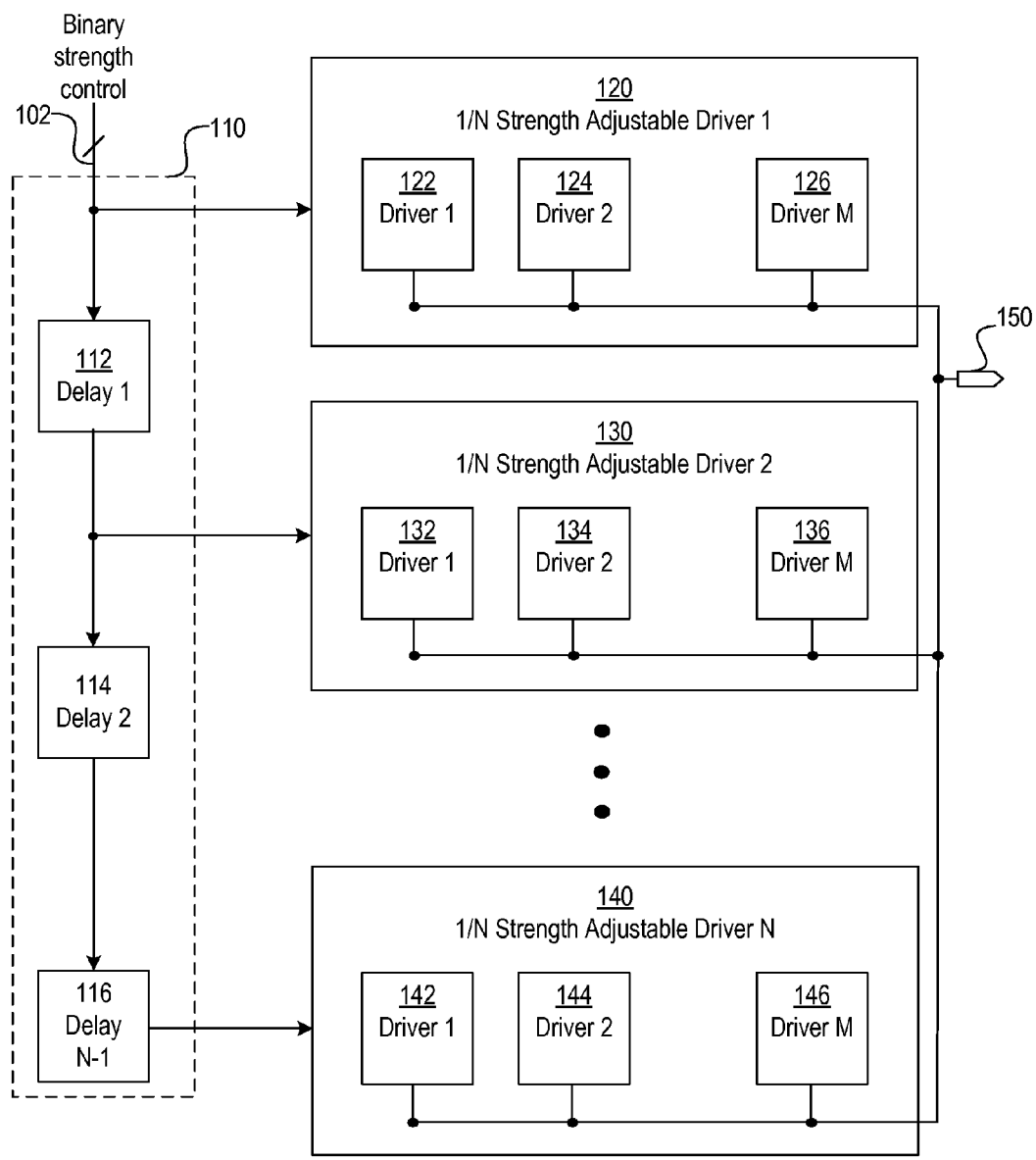
FIG. 1 shows a first driver circuit consistent with one or more implementations.

Some adjustable drivers include multiple, parallel-connected driver sub-circuits, which may be individually enabled/disabled to adjust drive strength. For instance, in some implementations, each driver sub circuit may be enabled/disabled by a respective bit of a binary control signal. By enabling/disabling the driver sub-circuits in various combinations, the drive strength may be adjusted. However, when adjustment of the drive strength requires the state of multiple driver sub-circuits to be changed, it is unlikely that the driver sub-circuits will change states exactly at the same time. During the time period in which the driver sub-circuits are changing state, an incorrect number of driver sub-circuits may be enabled, thereby causing the signal strength of the adjustable driver to be incorrect. For example, changing a 4-bit control signal from a power setting (0100) to a power setting (0011) involves changing the state of three bits (i.e., corresponding to three driver sub-circuits). Because the driver sub-circuits may change states at slightly different times, the transition from 0100 to 0011 may appear as a sequence of transitions including, for example, 0100→0101→0111→0011, or 0100→0000→0010→0011.

In some implementations, a circuit includes a plurality of smaller adjustable drivers, each including a respective set of driver sub-circuits and configured to drive the signal line with a fraction of a total drive strength specified by a binary control signal. For example, the circuit may include N adjustable drivers, each configured to provide $1/N^{th}$ of a total drive strength indicated by a binary control signal. As described above, during the time period in which one of the $1/N^{th}$ strength adjustable drivers is changing state (i.e., enabling/disabling driver sub-circuits), an incorrect drive strength may be exhibited. However, as the adjustable driver only provides $1/N^{th}$ of the total strength, the error in the total drive strength is approximately $1/N^{th}$ the error exhibited by a full-strength adjustable driver (which provides the entire drive strength used to drive the signal line).

In one or more implementations, the plurality of adjustable driver circuits are operated so that the strength of only one of the adjustable drivers may be adjusted at a time. In this manner, the error in the total drive strength is reduced by a factor of N, in comparison to the full-strength adjustable driver. For example, a full strength adjustable driver may be configured to provide 1 volt drive strength and exhibit an error of ±0.1 volts when strength is adjusted (i.e., by enabling/disabling driver sub-circuits). In comparison, each of N smaller adjustable drivers may provide $1/N^{th}$ volts of the total drive strength and exhibit an error of ±0.1/N volts when strength is adjusted. By operating the N smaller adjustable drivers in parallel and adjusting only one of the adjustable drivers at a time, a 1 volt drive strength can be achieved with an error of only ±0.1/N volts.

In some implementations, the adjustable drivers are configured to update strength settings at different times in response to a change in a total drive strength indicated by a binary control signal. For instance, the respective update times of the adjustable drivers may be separated by an amount of time sufficient to allow the update of each adjustable driver to complete before starting to update the next adjustable driver.

In some implementations, the different adjustment times of the adjustable drivers are achieved by delaying the binary control signal provided to each adjustable driver by a respective amount of time. For instance, the binary control signal may be delayed by different amounts of time using a plurality of delay circuits connected in series.

Strength adjustable drivers may be used in various applications to adjust drive strength and/or impedance of a circuit. For ease of explanation, the examples are primarily described with reference to adjustment of drive strength.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same items; however, in alternative examples the items may be different.

Turning now to the figures, FIG. 1 shows a first communication circuit consistent with one or more embodiments. The communication circuit includes a plurality of adjustable drivers 120, 130, and 140 having output nodes coupled to a signal line 150. Each of the adjustable drivers 120, 130, and 140 is configured to drive the signal line 150 with $1/N^{th}$ of a total drive strength in response to a binary control signal 102.

In this example, each of the adjustable drivers 120, 130, and 140 includes M driver sub-circuits that may be enabled/disabled. More specifically, adjustable driver 120 includes M driver sub-circuits 122, 124, and 126. Similarly, adjustable driver 130 includes M driver sub-circuits 132, 134, and 136, and adjustable driver 140 includes M driver sub-circuits 142, 144, and 146.

In some implementations, for example, each bit of the binary control signal 102 enables/disables one of the driver sub-circuits in each of the adjustable drivers 120, 130, and 140. For instance, driver sub-circuits 122, 132, and 142 may each be enabled/disabled by the first bit of the binary control signal. Similarly, driver sub-circuits 124, 134, and 144 may each be enabled/disabled by a second bit of the binary control signal, and driver sub-circuits 126, 136, and 146 may be enabled/disabled by a third bit.

The driver sub-circuits in a strength adjustable driver may be configured differently in different implementations. In some embodiments, each driver sub-circuit of an adjustable driver may contribute the same amount of drive strength. In some other implementations, different driver sub-circuits of an adjustable driver contribute different amounts of drive strength. For instance, each adjustable driver may include M driver sub-circuits having respective strengths 1×, 2×, 4×, . . . and $2^{M-1}$× for a unit drive strength of x.

As described above, the magnitude of the error presented by adjusting the strength of the adjustable drivers 120, 130, and 140 can be reduced by adjusting different ones of the adjustable drivers at different times. In some implementations, the adjustable drivers 120, 130, and 140 are configured to respond to changes in the binary control signal 102 at different times by delaying the control signal by a different amount for each of the adjustable drivers. In this example, the communication circuit includes a delay circuit 110 configured to provide the binary control signal 102 to each adjustable driver circuit with a respective amount of delay that is unique to the adjustable driver. The delay circuit 110 may include N−1 delays 112, 114, and 116 connected in series to generate N−1 binary control signals that are delayed versions of the input binary control signal 102.

The delays 112, 114, and 116 can be configured to ensure that only one of the adjustable driver circuits will be updated at a time. More specifically, so long as the delays 112, 114, and 116 delay signals by a time period greater than the duration of time needed for one of the adjustable driver circuits to change its strength setting by enabling or disabling its constituent driver sub-circuits, only one of the adjustable driver circuits will be updated at a time.

Figure 2:
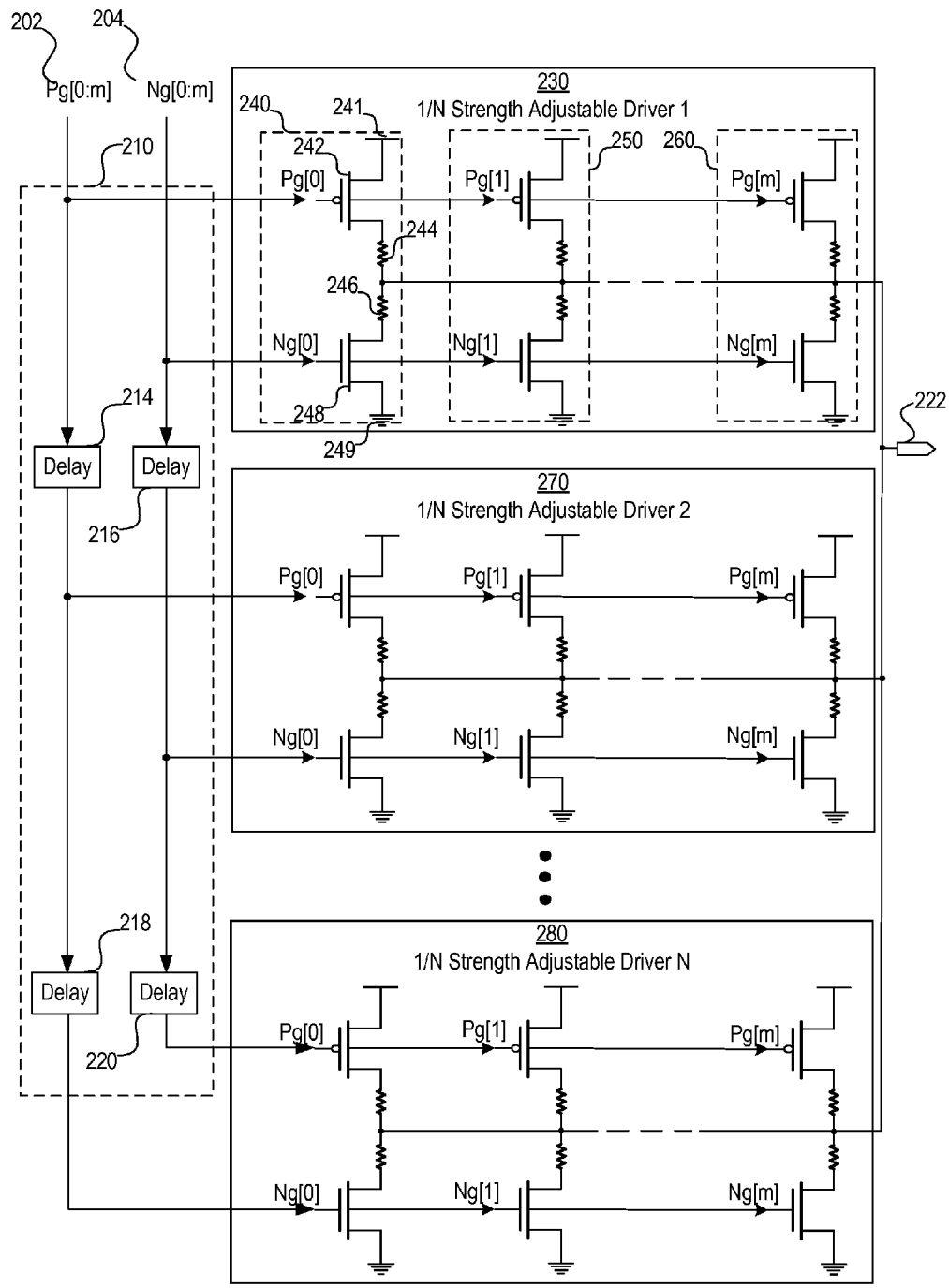
FIG. 2 shows a second driver circuit consistent with one or more implementations.

FIG. 2 shows a communication circuit according to a more detailed implementation. The communication circuit shown in FIG. 2 includes a plurality of adjustable drivers 230, 270, and 280 having output nodes coupled to a signal line 222. Each of the adjustable drivers 230, 270, and 280 is configured to drive the signal line 222 with $1/N^{th}$ of a total drive strength on the signal line in response to a value of binary control signals 202 and 204.

Similar to the communication circuit shown in FIG. 1, each of the 1/N adjustable drivers 230, 270, and 280 includes M driver sub-circuits that may be enabled/disabled to adjust drive strength provided by the adjustable drivers. For instance, adjustable driver 230 includes driver sub-circuits 240, 250, and 260. In this example, each of the driver sub-circuits includes a pull-up circuit (e.g., 242 and 244) and a pull-down circuit (e.g., 246 and 248). The binary control signal includes a pull-up control signal (Pg[0:m]) and a pull-down control signal (Ng[0:m]). The pull-up circuit of each driver sub-circuit 240, 250, and 260 is enabled/disabled by a respective bit of the pull-up control signal (Pg[0:m]). Similarly, the pull-down circuit of each driver sub-circuit 240, 250, and 260 is enabled/disabled by a respective bit of the pull-down control signal (Ng[0:m]). In this example, the pull-up circuit includes a transistor configured to connect the signal line 222 to a power terminal via a resistive path 244, in response to the pull-up control signal 202. In this example, the pull-down circuit includes a transistor configured to connect the signal line 222 to a ground terminal 249 via a resistive path 246, in response to the pull-down control signal 204.

Similar to the adjustable drivers shown in FIG. 1, the adjustable drivers 230, 270, and 280 are configured to respond to changes in the binary control signal 202 at different times by delaying the binary control signal by a different amount for each of the adjustable drivers.

The communication circuit includes a delay circuit 210 configured to provide the pull-up and pull-down control signals to each adjustable driver circuit with a respective amount of delay that is unique to the adjustable driver. The delay circuit 210 includes N−1 delays 214 and 218 connected in series to provide the pull-up control signal 202 to each of the adjustable drivers with a respective amount of delay. Similarly, the delay circuit 210 includes N−1 delays 216 and 220 connected in series to provide the pull-down control signal 204 to each of the adjustable drivers with a respective amount of delay.

Figure 3:
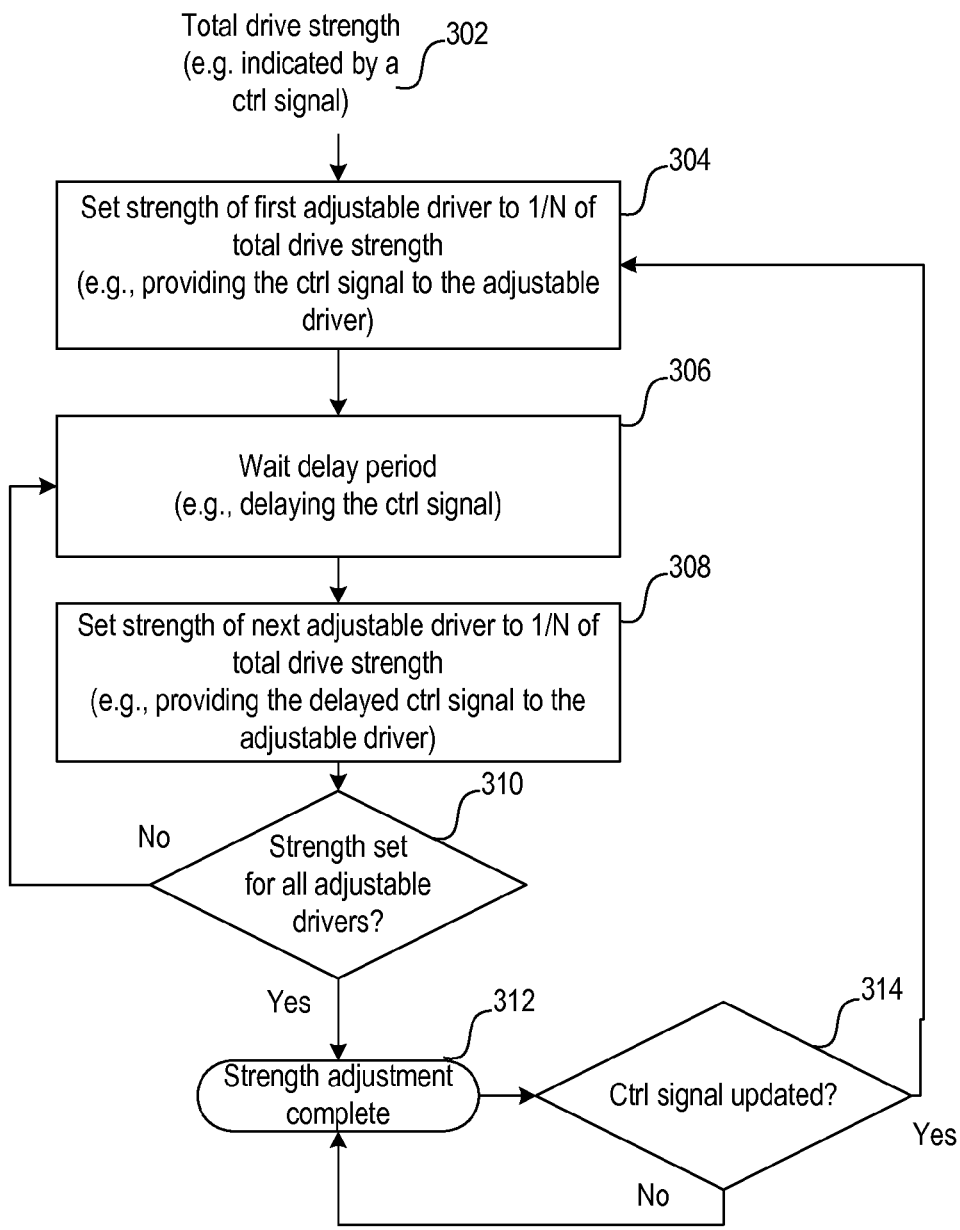
FIG. 3 shows a process for operating a driver circuit.

FIG. 3 shows a process for operating a driver sub-circuit, in accordance with one of more implementations. A signal that indicates a total drive strength 302 is input (e.g., a binary control signal). Strength of a first adjustable driver is set to $1/N^{th}$ of the total drive strength at block 304. As described with reference to FIGS. 1 and 2, in some implementations, the drive strength may be set by providing a binary control signal to the adjustable driver. The process waits for a delay period at block 306 and then sets the strength of the next adjustable driver to $1/N^{th}$ of the total drive strength at block 308. In some implementations, the waiting may be achieved by delaying the binary control signal provided to the previous adjustable driver for the delay period. Decision block 310 repeats blocks 306 and 308 for other adjustable driver sub-circuits until the strength has been set for all of the adjustable drivers, after which point strength adjustment is completed and the process transitions to block 312.

After strength adjustment is completed, the input signal may change to indicate a new drive strength. If the input signal changes, decision block 314 sets the first adjustable driver to $1/N^{th}$ of the new total drive strength at block 304 and the process is repeated for each of the other adjustable drivers at blocks 306, 308, and 310 as described above.

As discussed above, some implementations ensure that only one adjustable driver is updated at a given time by providing a binary control signal, indicating the total strength, to the adjustable drivers at different times. However, other mechanisms may be used to control the times at which the respective adjustable drivers respond to changes in the binary control signal. For example, in some implementations, each of a plurality of adjustable drivers is configured to only respond to changes of the binary control signal, when the adjustable driver is enabled by a control circuit.

Figure 4:
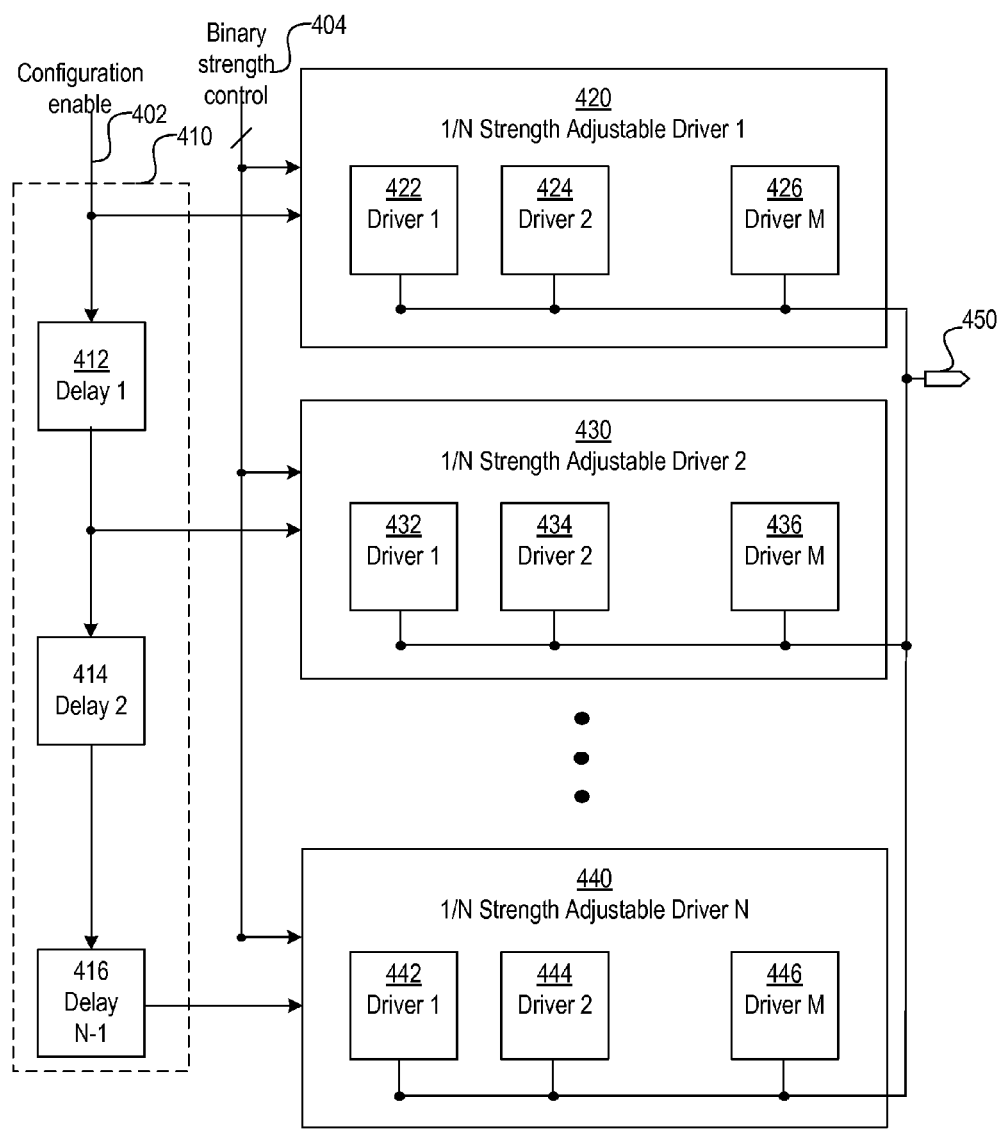
FIG. 4 shows a third driver circuit consistent with one or more implementations.

FIG. 4 shows a communication circuit having a plurality of adjustable drivers 420, 430, and 440 having output nodes coupled to a signal line 450. Each of the adjustable drivers 420, 430, and 440 is configured to drive the signal line 450 with $1/N^{th}$ of a total drive strength, indicated by a binary control signal 404. The adjustable drivers 420, 430, and 440 are each configured to only adjust the drive strength of the adjustable driver when enabled by configuration enable signal 402.

Each of the adjustable drivers 420, 430, and 440 includes M driver sub-circuits that are enabled/disabled by a respective bit of the binary control signal when the adjustable driver is enabled by the configuration enable signal 402. More specifically, adjustable driver 420 includes M driver sub-circuits 422, 424, and 426. Similarly, adjustable driver 430 includes M driver sub-circuits 432, 434, and 436, and adjustable driver 440 includes M driver sub-circuits 442, 444, and 446.

The communication circuit includes a control circuit 410 that is configured to provide the configuration enable signal 402 to the adjustable drivers 420, 430, and 440 at different times. In this example, the control circuit 410 includes N−1 delays 412, 414, and 416 connected in series to generate N−1 signals that are delayed versions of the configuration enable signal 402. The delays 412, 414 and 416 can be configured to ensure that only one of the adjustable drivers will be updated at a time.

Figure 5:
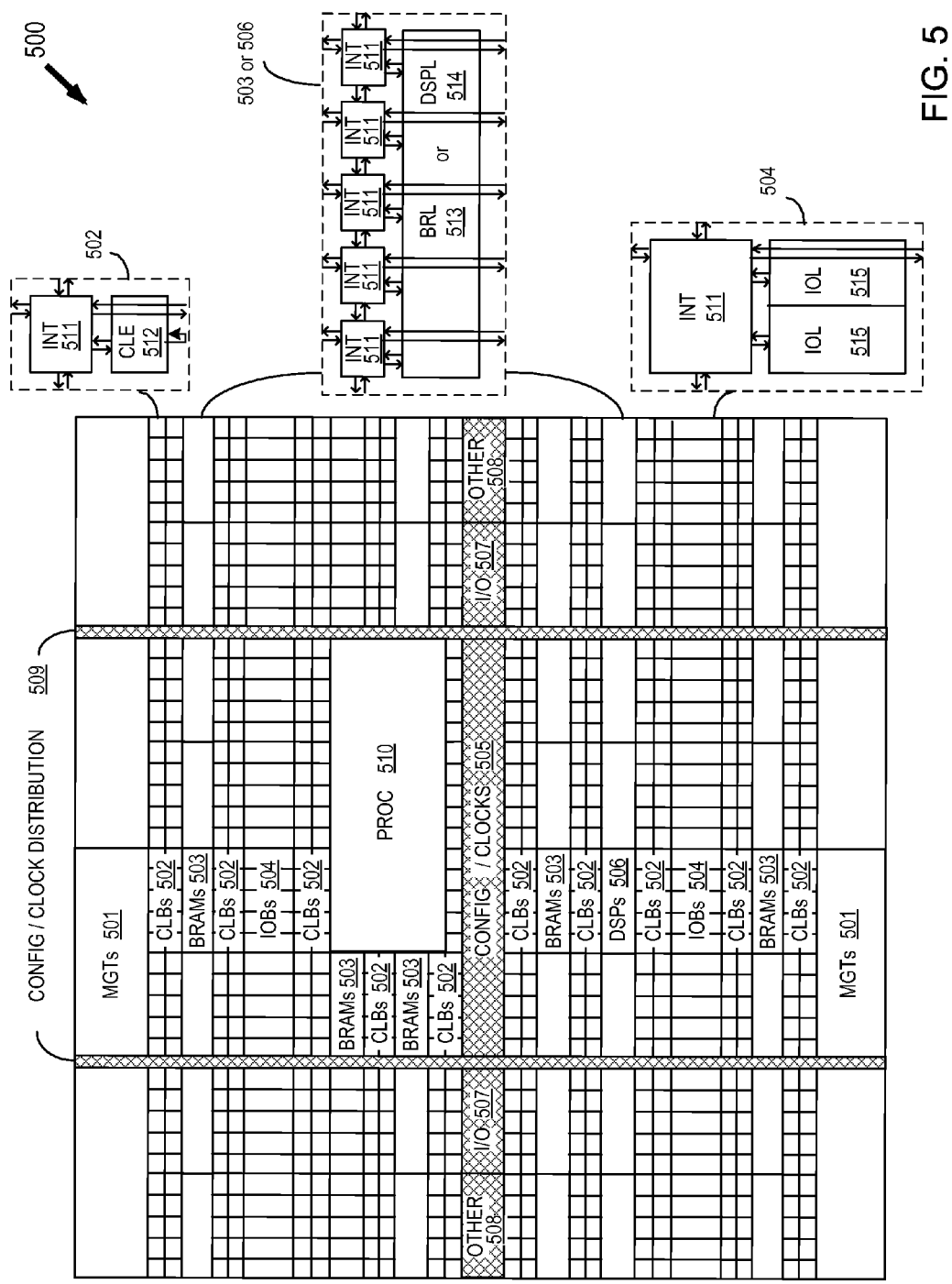
FIG. 5 shows a programmable IC that may be configured to include one or more of the disclosed driver circuits.

FIG. 5 is a block diagram of an example programmable integrated circuit. As previously described, a programmable IC may include a communication circuit having a plurality of adjustable driver circuits configured in accordance with one or more embodiments. The type of programmable IC shown in this example is known as a field programmable gate array (FPGA). FPGAs can include several different types of programmable logic blocks in the array. For example, FIG. 5 illustrates an FPGA architecture (500) that includes a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507, for example, clock ports, and other programmable logic 508 such as digital clock managers, analog-to-digital converters, system monitoring logic, and so forth. Some FPGAs also include dedicated processor blocks (PROC) 510 and internal and external reconfiguration ports (not shown).

In some FPGAs, each programmable tile includes a programmable interconnect element (INT) 511 having standardized connections to and from a corresponding interconnect element in each adjacent tile. Therefore, the programmable interconnect elements taken together implement the programmable interconnect structure for the illustrated FPGA. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic, plus a single programmable interconnect element INT 511. A BRAM 503 can include a BRAM logic element (BRL) 513 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element (DSPL) 514 in addition to an appropriate number of programmable interconnect elements. An 10B 504 can include, for example, two instances of an input/output logic element (IOL) 515 in addition to one instance of the programmable interconnect element INT 511. As will be clear to those of skill in the art, the actual I/O bond pads connected, for example, to the I/O logic element 515, are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The circuits and methods are thought to be applicable to a variety of systems for adjusting drive strength. Other aspects and features will be apparent to those skilled in the art from consideration of the specification. The circuits and methods may be implemented as an application specific integrated circuit (ASIC) or as a logic circuit on a programmable IC. It is intended that the specification and drawings be considered as examples only, with a true scope of the invention being indicated by the following claims.

What is claimed is:

1. An apparatus, comprising:
   a plurality of adjustable driver circuits having output nodes coupled to a signal line, each adjustable driver circuit of the plurality of adjustable driver circuits coupled to a binary control signal and including a plurality of three or more driver sub-circuits, each adjustable driver circuit configured to:
      receive a common set of bits from the binary control signal;
      drive the signal line using the driver sub-circuits; and
      adjust a respective drive strength by enabling and disabling the driver sub-circuits in response to respective bits from the common set of bits of the binary control signal;
   wherein each of the plurality of adjustable driver circuits is configured to drive the signal line with a drive strength equal to a respective portion of a total drive strength indicated by a value of the binary control signal; and
   a delay circuit configured to offset the enabling and disabling of driver sub-circuits in respective adjustable driver circuits by delaying the common set of bits of the binary control signal by respective time periods unique to each adjustable driver circuit.

2. The apparatus of claim 1, wherein the delay circuit is configured to delay the common set of bits to mitigate for error of the total drive strength, the error due to timing differences in enabling and disabling the driver sub-circuits within each of the plurality of adjustable driver circuits.

3. The apparatus of claim 1, wherein each adjustable driver circuit is configured to respond to changes in the binary control signal within a first duration of time after the binary control signal is received by the adjustable driver circuit; and
   the delay circuit includes N−1 delays connected in series, each of the N−1 delays being configured to delay received signals by a second duration of time that is greater than the first duration of time.

4. The apparatus of claim 1, wherein there are N adjustable driver circuits and each of the adjustable driver circuits is configured to provide 1/N of the total drive strength.

5. The apparatus of claim 1, wherein:
   the binary control signal is a multi-bit signal;
   for each of the plurality of adjustable driver circuits,
   the plurality of driver sub-circuits is enabled by a respective bit of the binary control signal; and
   each bit of the binary control signal enables at least one of the respective plurality of driver sub-circuits in each of the plurality of adjustable driver circuits.

6. The apparatus of claim 5, wherein each of the plurality of driver sub-circuits includes a respective pull-up circuit and a respective pull-down circuit.

7. The apparatus of claim 1, wherein the binary control signal indicates a pull-up drive strength and a pull-down drive strength.

8. The apparatus of claim 1, wherein for one of the plurality of adjustable driver circuits a length of respective time period unique to the adjustable driver circuit is zero.

9. A method, comprising:
   driving a signal line with total drive strengths equal to values indicated in a binary control signal, by performing operations including:
      setting each of a plurality of adjustable driver circuits to provide a first drive strength indicated in a common set of bits from the binary control signal by enabling and disabling driver sub-circuits of a respective plurality of driver sub-circuits in each of the adjustable driver circuits, each driver sub-circuit enabled or disabled in response to a respective bit of the common set of bits from the binary control signal;
      in response to the binary control signal changing to indicate a second drive strength, updating each of the adjustable driver circuits to collectively provide the second drive strength, while offsetting enabling and disabling of the driver sub-circuits in the adjustable driver circuits by delaying the common set of bits by respective time periods unique to each adjustable driver circuit; and
      in response to the binary control signal changing to indicate a third drive strength different from the first and second drive strengths, updating each of the adjustable driver circuits to collectively provide the third drive strength, while offsetting enabling and disabling of the driver sub-circuits in the adjustable driver circuits by delaying the common set of bits by the respective time periods unique to each adjustable driver circuit.

10. The method of claim 9, wherein:
    there are N adjustable driver circuits in the plurality of adjustable driver circuits and each of the N adjustable driver circuits is updated to provide 1/N of the first, second, and third drive strengths.

11. The method of claim 10, further comprising:
    driving, at each of the N adjustable driver circuits, the signal line with a signal having 1/N of the total drive strength indicated by the respective control signal within a first duration of time after the respective control signal is received by the adjustable driver circuit; and the respective time periods unique to the respective adjustable driver circuits are separated from each other by a duration of time greater than the first duration of time.

12. The method of claim 10, wherein the delaying of the binary control signal includes, providing the binary control signal to an input of N−1 delay circuits connected in series.

13. The method of claim 10, wherein for one of the plurality of adjustable driver circuits a length of the respective time period unique to the adjustable driver circuit is zero.

14. The method of claim 9, wherein:
the binary control signal is a multi-bit signal;
each of the plurality of adjustable driver circuits includes a respective plurality of driver sub-circuits;
each of the plurality of driver sub-circuits is enabled by a respective bit of the binary control signal; and
each bit of the binary control signal enables at least one of the respective plurality of driver sub-circuits in each of the plurality of adjustable driver circuits.

15. The method of claim 10, wherein the setting of each of the adjustable driver circuits to provide 1/N of a first drive strength indicated in the binary control signal includes:
setting each of the adjustable driver circuits to provide 1/N of a first pull-up drive strength indicated in the binary control signal; and
setting each of the adjustable driver circuits to provide 1/N of a first pull-down drive strength indicated in the binary control signal.

16. An apparatus, comprising:
a plurality of adjustable driver circuits, the plurality including N adjustable driver circuits having output nodes coupled to a signal line, each adjustable driver circuit having a first control input configured to receive a binary control signal input to the apparatus, and a second control input configured to receive a respective enable signal;
wherein for each total drive strength of three or more different total drive strengths, and in response the total drive strength being indicated by a binary control signal:
each adjustable driver circuit is configured to receive a common set of bits in the binary control signal and delay adjustment of a indicated change in drive strength until receipt of a corresponding enable signal;
each adjustable driver circuit includes a respective plurality of driver sub-circuits each configured to provide a fixed drive strength in response to the delayed adjustment and a respective bit of the binary control signal; and
a control circuit configured to set a timing for the respective enable signals provided to the plurality of adjustable driver circuits to cause the plurality of adjustable driver circuits to respond to changes in the binary control signal one at a time.

17. The apparatus of claim 16, wherein the control circuit is configured to enable each of the plurality of adjustable driver circuits in a respective time period, unique to the adjustable driver circuit, following a change in the binary control signal.

18. The apparatus of claim 16, wherein:
the plurality of adjustable driver circuits includes N adjustable driver circuits, each configured to:
drive the signal line with a drive strength equal to 1/N of a total drive strength on the signal line.

19. The apparatus of claim 18, wherein each of the plurality of adjustable driver circuits is configured to:
respond to changes in the binary control signal within a first duration of time after the binary control signal is received and the adjustable driver circuit is enabled; and
the control circuit includes N−1 delays connected in series, each of the N−1 delays being configured to delay an input enable signal by a second duration of time that is greater than the first duration of time.

20. The apparatus of claim 16, wherein:
the binary control signal is a multi-bit signal;
each of the plurality of adjustable driver circuits includes a respective plurality of driver sub-circuits;
each of the plurality of driver sub-circuits is enabled by a respective bit of the binary control signal; and
each bit of the binary control signal enables at least one of the respective plurality of driver sub-circuits in each of the plurality of adjustable driver circuits.

\* \* \* \* \*